United States Patent [19]

Yasue et al.

[11] 4,410,063

[45] Oct. 18, 1983

[54] LOUDSPEAKER SYSTEM

[75] Inventors: Akira Yasue, Nara; Toshiji Kato, Hirakata; Yozo Takahashi, Ibaragi, all of Japan

[73] Assignee: Onkyo Kabushiki Kaisha, Neyagawa, Japan

[21] Appl. No.: 322,912

[22] Filed: Nov. 19, 1981

[30] Foreign Application Priority Data

| | | | |
|---|---|---|---|
| Mar. 4, 1981 | [JP] | Japan | 56-30666[U] |
| Mar. 4, 1981 | [JP] | Japan | 56-30667[U] |
| Sep. 5, 1981 | [JP] | Japan | 56-142806 |

[51] Int. Cl.³ .......... H05K 5/00

[52] U.S. Cl. .......... 181/147; 181/199; 179/146 E; 381/99

[58] Field of Search .......... 181/144–147, 181/155, 156, 199; 179/1 E, 1 GA, 1 GP, 1 GQ, 1 G

[56] References Cited

U.S. PATENT DOCUMENTS

| | | | |
|---|---|---|---|
| 4,006,311 | 2/1977 | Carlsson | 181/147 X |
| 4,073,365 | 2/1978 | Johnson | 181/147 |
| 4,179,585 | 12/1979 | Herrenschmidt | 179/1 E |
| 4,225,010 | 9/1980 | Smith | 181/199 X |
| 4,227,050 | 10/1980 | Wilson | 181/144 X |

*Primary Examiner*—Benjamin R. Fuller

*Attorney, Agent, or Firm*—Cushman, Darby & Cushman

[57] ABSTRACT

A loudspeaker system with a plurality of direct loudspeakers mounted on an enclosure front for radiating in a forward direction and at least one compensation loudspeaker for each loudspeaker. The compensation speakers are mounted to direct sounds rearwardly so that both the sound pressure as a result of the direct sounds and the sound pressure as a sum of the direct and indirect sounds are substantially independent of frequency.

14 Claims, 17 Drawing Figures

LOUDSPEAKER SYSTEM

BACKGROUND OF THE INVENTION

1. Field of the Invention

This invention relates to improvement of loudspeaker systems and particularly to such selection and arrangement of each of loudspeakers on an enclosure of a loudspeaker system and determination of the reproduction frequency ranges covered by the respective loudspeaker as to provide natural and life-like sounds reproduction substantially independent of the acoustic conditions of the listening room.

2. Description of the Prior Art

It is desired that a loudspeaker system should provide the listener with sounds reproduced at a same level independent of the frequency.

In this regard, in conventional practice the contribution of indirect sounds effect has been disregarded and too much importance has been attached to the frequency response characteristics which are normally determined by measuring the sound pressure in front of the loudspeaker in an anechoic room, altering the frequency of the sounds. In other words, importance has been attached to only the characteristics of the sounds which reaches the listener directly from the loudspeakers.

Thus the main object of the conventional designing has been simply to flatten or level off the frequency response characteristics over a sufficiently wide frequency range.

For example, taking a conventional 2-way loudspeaker system as shown in FIG. 1, there is provided a low range loudspeaker (1) and a high range loudspeaker (2) on an enclosure (3).

Shown in FIG. 2 is a combined chart of frequency response characteristics of the loudspeaker system of FIG. 1, as measured in an anechoic room, where curves (A) (B) (C) represent those of the low range loudspeaker (1), the high range loudspeaker (2) and the total system of the combination of both of them, respectively. On the other hand, shown in FIG. 3 is a combined chart of the corresponding sound power characteristics, as measured in an reverberant room, where curves (A′) (B′) (C′) correspond to (A) (B) (C) in FIG. 2, respectively. In designing such loudspeaker system, it is the objecting general way to aim at realizing flatness of the frequency response characteristics of the total system as far as possible, and for this purpose the network circuit is designed in such manner that input signal level to the respective loudspeaker shows 3dB attenuation at the crossover frequency $f_c$, which is the frequency where said respective frequency response characteristics curves (A) (B) of said two loudspeakers cross with each other.

It should be noted here, however, that said frequency response characteristics are those of only the direct sounds on the radiation axis in an anechoic room, while in actual use in usual listening rooms the listener will hear not only the said direct sounds but a succession of indirect sounds reflected from the ceiling, side walls and the like, as well.

It is, therefore, desirable to design loudspeaker system in such manner that the sounds pressure as a sum of the direct and indirect sounds remains constant independently of the frequency. As is well known, however, loudspeaker have the directivity that will become sharper as reproduction sounds frequency becomes higher, which means that lower level of sounds pressure is radiated in directions away from the radiation axis, and thus weaker sounds pressure is reflected from the ceiling, side walls and the like, as the frequency becomes higher. Namely, the higher the reproduction sound frequency, the weaker will become the intensity of the indirect sounds.

When the sound power (defined by $P=\int P\theta\phi d\omega$: with P: sound power, i.e. sound source power output; $\omega$: solid angle; $P\theta\phi$: power intensity in the directional angles $\theta$, $\phi$ and approximated by $P=\Sigma P\theta\phi\Delta\omega$ with $P\theta\phi$ measured in an anechoic room) is considered with the loudspeaker system of conventional design as mentioned at the beginning, the sound power level begins to decline, with respect to each of the low range loudspeaker (1) and the high range loudspeaker (2), at the respective particular frequency at which the directivity begins to become evident with respect to said each loudspeaker. A loudspeaker having by nature such characteristics, the conventional loudspeaker systems as described above give forth indirect sound pressure which varies depending upon the frequency, thus failing to provide life-like sound reproduction.

However, the role of indirect sounds has recently come to be taken into account in order that the listeners may hear life-like reproduced sounds, since the listener in fact hears simultaneously not only the direct sounds from the loudspeakers but also the indirect sounds reflected from the ceiling, walls and the like of the listening room. It is true that there have been already made some invention, such as U.S. Pat. Nos. 4,006,311 and 4,179,585, which provide positively indirect sounds, but these patents aim to widen the space of propagation of the reproduced sounds and to provide the indirect sounds in the high frequency respectively, rather than to level off the characteristics of the total sounds, and therefore the listener can not as yet hear life-like and natural sounds as expected.

Japanese Patent Publication Sho. 54-33854 discloses another type of invention whose object is to provide the listener with natural and life-like reproduced sounds in such a manner that sound power characteristics of the entire listening space as intended, is to be flat, under due consideration of the indirect sounds effect, but this type of loudspeaker system after all provided no other than the flat sound power characteristics, but did not provide the flat frequency response characteristics straight in front of the loudspeaker system, producing direct sounds which have no flat characteristics, which makes the listener feel unnatural in the sound reproduction.

It should be further noticed in this regard that it has heretofore been considered that the frequency $f_1$ beyond which the sound power depression becomes evident on account of the directivity of the loudspeaker is a value derived theoretically in modelling the same as a piston, namely $$f_1=c/2\pi a$$

with c: sound velosity and a: effective vibration radius of the loudspeaker, but various experiments have now revealed that such frequency $f_1$ is not quite true with respect to actual loudspeakers, thus making it clear that improvement is required also in this regard.

Consequently, it has been revealed that this is also one of the reasons why the conventional loudspeaker systems with the loudspeakers disposed on the front panel fail to provide flat sound power characteristics, as shown at (C) in FIG. 3, which consequently leads to unfavorable unnatural aural result on account of the uneven depression appearing in a particular frequency range in the indirect sounds.

SUMMARY OF THE INVENTION

The object of the present invention is to overcome the aforementioned defects of the conventional loudspeaker systems and thus provide far more life-like reproduced sounds.

For this purpose, the loudspeaker system according to this invention has at least a compensation loudspeaker adapted to reproduction only in the aforementioned frequency range where the depression of radiated sound power from the loudspeaker on the front panel would be evident, so as to augment the indirect sounds mainly reflected from backside walls by means of the radiation backwardly of the enclosure; the loudspeaker system comprises at least a front loudspeaker on a front panel of an enclosure provided in such manner that its radiation axis, extends straight forward and its frequency response characteristics is substantially flat, and a compensational reproduction sound apparatus with at least a loudspeaker provided in such manner that it radiates, in the substantial backward space, sounds whose frequency is limited within the range of depression of the sound power of said front loudspeaker.

What is meant by radiating sounds in the substantial backward space, here, is radiation of sounds in such manner that the pressure of the sounds from said compensational apparatus does not propagate directly in the front space of the enclosure so as not to effect frequency response characteristics measured in front of the loudspeaker system in an anechoic room, but the radiation is directed strictly rearwardly of the enclosure.

Thus according to the principle of this invention, it has now been made possible to retain substantial flatness of the frequency response characteristics with respect to the direct sounds in the listening space, and at the same time to keep the sound power characteristics substantially flat independently of the frequency with respect to entire loudspeaker system.

It is thus possible for the listener to hear the direct sounds independent of the frequency, and also the total combined direct and indirect sounds independent of the frequency, which means that the listeners can hear natural and life-like sounds in any room which may be widely different with respect to acoustic conditions.

In addition to the fact that sound power radiated from loudspeaker shows depression as become evident beyond the particular frequency at which the directivity of the loudspeaker becomes gradually evident, such frequency $f_1$ has conventionally been considered, as aforementioned, $$f_1 = c/2\pi a$$

with c: sound velocity and a: effective vibration radius of the respective loudspeaker, but various experiments have now revealed that such frequency $f_1$ should be in fact expressed as:

$$f_1 = (0.5 \sim 0.6)c/2\pi a.$$

Further summarizing the above, the loudspeaker system according to the principle of this invention is adapted to retain the substantial flatness of frequency response characteristics of said at least a front loudspeaker and at least a compensational loudspeaker is intalled in such manner that the latter improves only the sound power characteristics without affecting said frequency response characteristics so as to prevent undesirable aurally unnatural depression in any particularly frequency range.

DETAILED DESCRIPTION OF THE PREFERRED EMBODIMENTS

Figure 4:
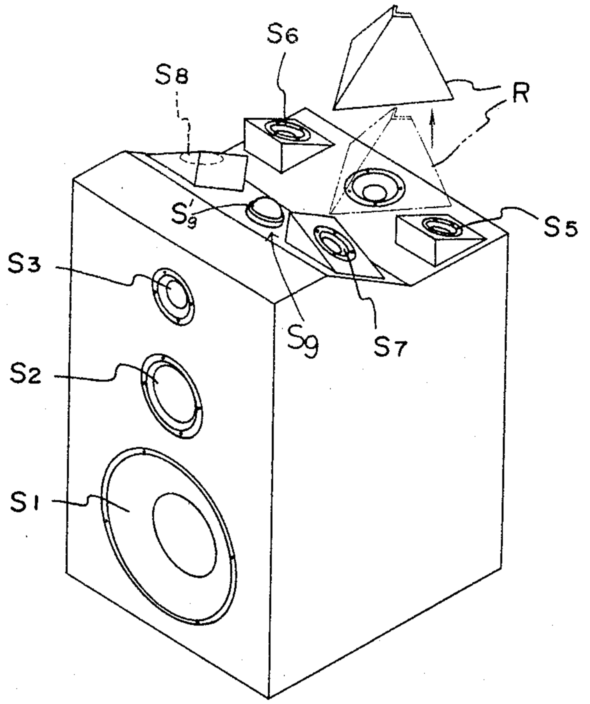
FIG. 4 shows an embodiment of this invention as applied to a loudspeaker system including 3-way front loudspeakers.
Figure 5:
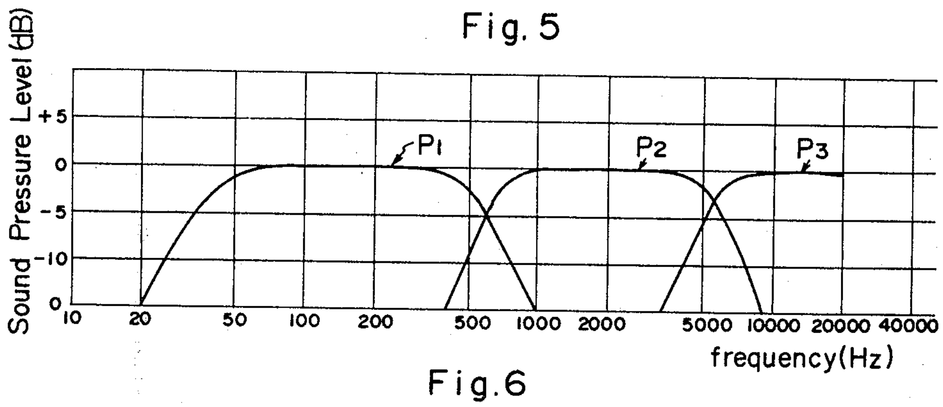
FIG. 5 is a diagrammatic representation showing how the frequency ranges are covered by the respective front loudspeakers of the loudspeaker system of FIG. 4 with respect to frequency response characteristics.

Referring to FIG. 4 loudspeakers ($S_1$) ($S_2$) and ($S_3$) supported on the front panel of an enclosure are respectively for the low range, mid range and high range. Shown in FIG. 5 is a representation of the frequency response characteristics in front of the loudspeaker system, made up of the components shown as curves ($P_1$) ($P_2$) ($P_3$) which show the frequency ranges covered by the respective loudspeakers, to result in a flat ultimate form over the entire reproduction sound frequency range. Supported on a top plate are loudspeakers ($S_4$), ($S_5$), ($S_6$), ($S_7$), ($S_8$), ($S_9$), which are the loudspeakers for compensation of the sound power, disposed with their sound radiation center axes extending in the respective rearward slant direction.

Figure 6:
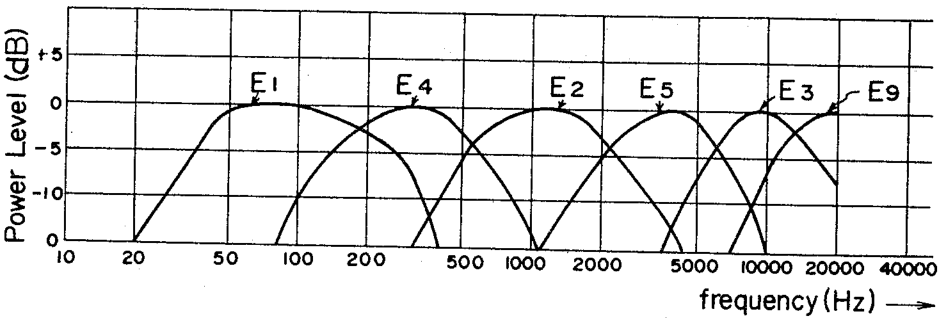
FIG. 6 is a diagrammatic representation showing how the frequency ranges are covered by all the loudspeakers of the loudspeaker system of FIG. 4 with respect to sound power characteristics.

The compensation loudspeaker ($S_4$) is intended for compensation for the lower frequency loudspeaker ($S_1$), and is disposed in such a manner that the sound therefrom is reflected by a reflector plate (R) disposed thereover to then propagate divergingly rearwardly upwardly and ultimately to provide the indirect sounds. The reflector plate (R) is in fact made of two trapezoid component plates, as combined in abutment in V-shaped angle as seen in FIG. 4. Sound power characteristics of the said two loudspeakers ($S_1$), ($S_4$) are shown in FIG. 6 as curves ($E_1$) and ($E_4$), respectively. The rest, namely ($S_5$), ($S_6$), ($S_7$) and ($S_8$), are intended for compensation for the mid range loudspeaker ($S_2$). Of these four, ($S_5$), ($S_6$) are disposed to face rearwardly upwardly, while ($S_7$) and ($S_8$) face rearwardly upwardly in an angle to the right and left, respectively. With such disposition, the compensational sounds radiated from the loudspeakers ($S_5$), ($S_6$), ($S_7$) and ($S_8$) propagate into the space divergingly to the right and left and rearwardly upwardly, and are then reflected by the walls and the like rearwardly of the enclosure, thus to provide the indirect sounds. Characteristics of the sound power by means of such loudspeakers ($S_5$), ($S_6$), ($S_7$) ($S_8$) are represented by curve ($E_5$) in FIG. 6, thus providing compensation for the frequency range where depression is evident is the sound power of the mid range loudspeaker ($S_2$) as represented by curve ($E_2$).

The loudspeaker ($S_9$) is intended for compensation for the high range loudspeaker ($S_3$), and is made to radiate sounds through an annular ring slit as shown at ($S_9'$).

This loudspeaker ($S_9$) is so disposed that the center axis extends rearwardly upwardly and therefore that the radiation sounds propagate divergingly into the entire space rearwardly upwardly. Characteristics of the soundpower of the high range loudspeaker ($S_3$) and the compensation loudspeaker ($S_9$) therefor, are represented in FIG. 6 by curves ($E_3$) and ($E_9$), respectively. As is clear from FIG. 6, sound power characteristics with respect to the combined entire sounds will be substantially flat over the entire reproduction sound frequency.

Figure 7:
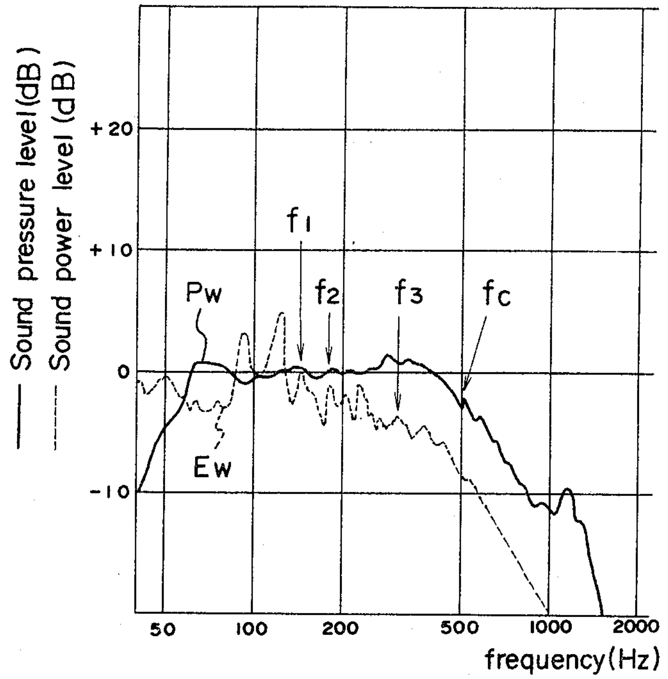
FIG. 7 is a representation showing the result of the actual measurement of both the frequency response characteristics and the sound power characteristics with respect to the low range loudspeaker used in the loudspeaker system of FIG. 4.

FIG. 7 is a representation showing both the frequency response characteristics ($P_w$) and the sound power characteristics ($E_w$), of only the low range loudspeaker ($S_1$), as actually measured, with the effective vibration radius of the speaker determined as 34 cm. Designated in FIG. 7 at ($f_1$), ($f_2$), ($f_3$), ($f_c$) are the frequencies:

$$f_1 = 0.5c/2\pi a_1 \ (\approx 160 \text{ Hz})$$

$$f_2 = 0.6c/2\pi a_1 \ (\approx 190 \text{ Hz})$$

$$f_3 = c/2\pi a_1 \ (\approx 320 \text{ Hz})$$

wherein $a_1$ is the said effective vibration radius of this low range loudspeaker ($S_1$)

and $f_c$ 500 Hz, which is the crossover frequency when considered in combination with the mid range loudspeaker.

Further, the chart of sound power level ($E_w$) shows a higher level than that of the actual sound power radiated from the loudspeaker, at the frequency range lower than about 50 Hz, because the shape of a reverberant room causes resonance in this frequency range, and a standing wave exists, and therefore this chart is to show depression like that of the sound pressure level ($P_w$) (frequency response characteristics) without the resonance. Based on the chart, it may be said that the sound power depression becomes evident beyond the region around $(0.5\sim0.6)c/2\approx a_1$ and therefore that the optimum compensation by means of the compensation loudspeaker should cover the frequency range from $(0.5\sim0.6)c/2\pi a_1$ to the crossover frequency $f_c$ as considered in combination with the loudspeaker covering the next adjacent higher frequency range. However, certain degree of improvement may accordingly be expected when the compensation covers the range for instance from $c/2\pi a_1$ to the said crossover frequency $f_c$, or some frequency range within such depression range.

Figure 8:
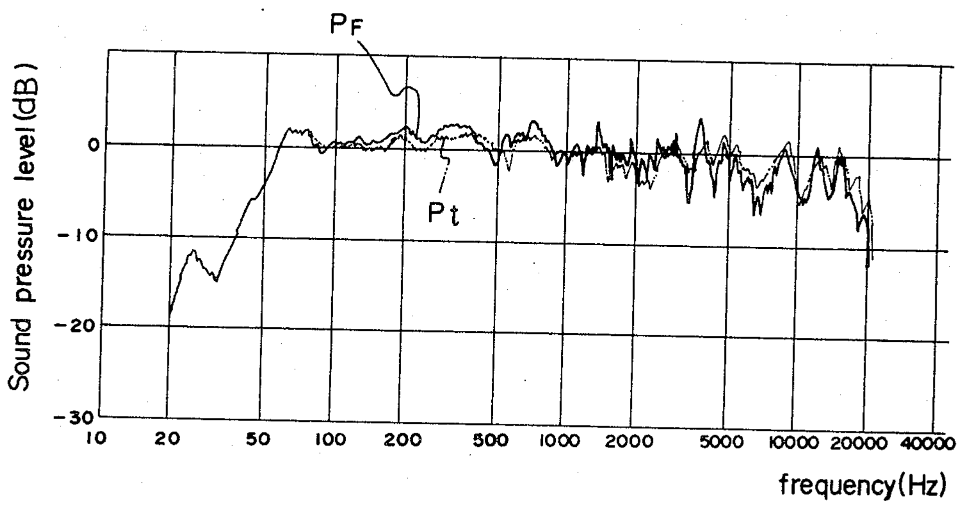
FIG. 8 is a representation showing, for comparison, both the frequency response characteristics only of the front loudspeakers and that of the combined sounds including those of the compensation loudspeakers, of the loudspeaker system of FIG. 4, both measured in an anechoic room.

Now, characteristics of the said loudspeaker system shown in FIG. 4 as an embodiment of this invention is described hereinafter:

FIG. 8 shows frequency response characteristics, as measured straight in front of the loudspeaker, when operating only the front loudspeakers ($S_1$), ($S_2$), ($S_3$) and when operating them together with the compensation loudspeakers, ($S_4$), ($S_5$), ($S_6$), ($S_7$), ($S_8$), ($S_9$) as curves $P_F$ and $P_t$, respectively. Based on the chart, it may be said that the direct sounds from the compensation loudspeakers do not substantially affect the direct sounds of the front panel loudspeakers. Note here that the said characteristics have been measured in an anechoic room, or in other words that the direct sounds from the loudspeakers have been measured.

Figure 9:
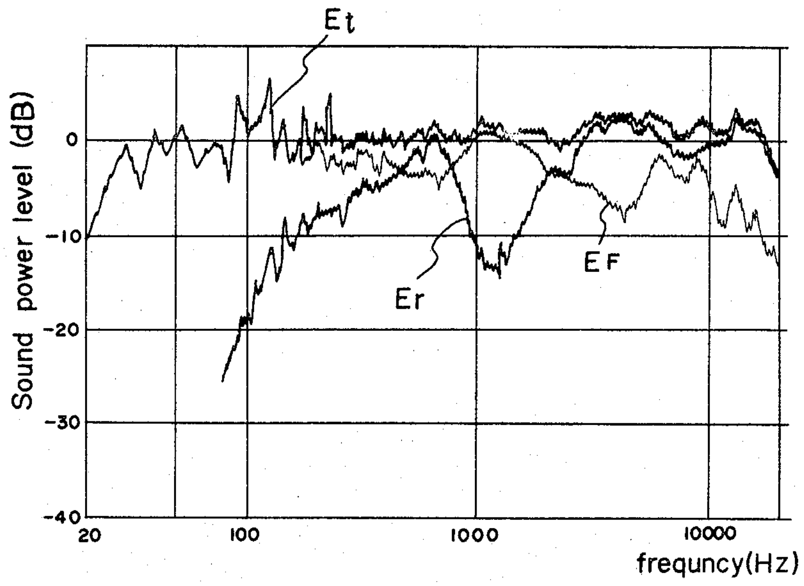
FIG. 9 is a representation, for comparison, showing the sound power characteristics of only the front speakers, that of only the compensation loudspeakers, and that of the combined sounds including both of the two groups, measured respectively in an echo room.

FIG. 9 is a representation of the sound power characteristics measured in an echo room, and shown at curve ($E_F$) is for operating only the front panel loudspeakers, at curve ($E_r$) is for operating only the compensation loudspeakers, and at curve ($E_t$) is for operating all of the said loudspeakers; the curve ($E_t$) appearing substantially flat over the entire reproduction sound frequency range.

Figure 10:
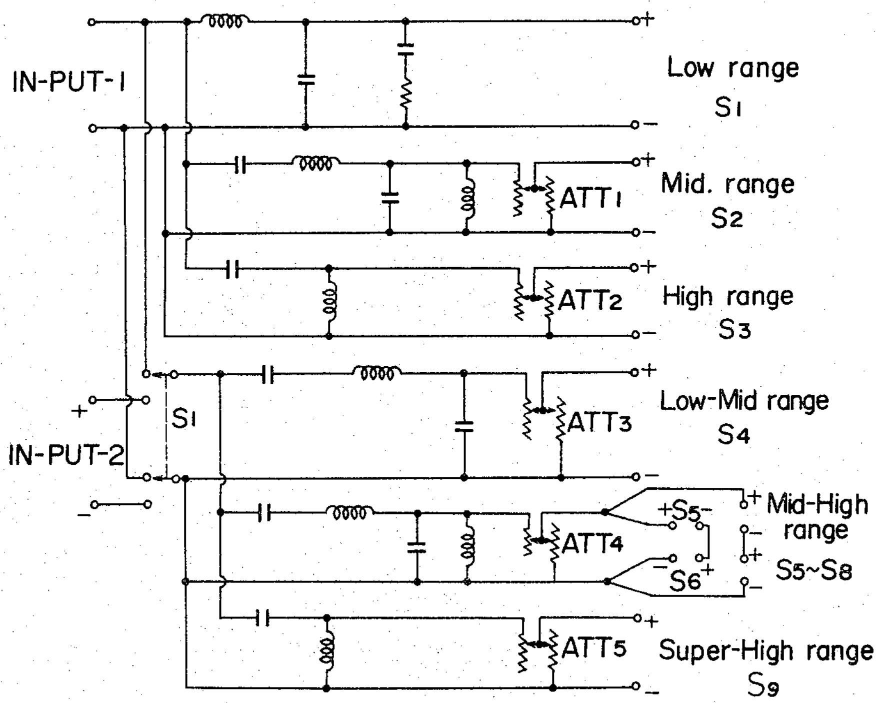
FIG. 10 is a circuit diagram of a crossover network used in the loudspeaker system of FIG. 4, and FIG. 11 through FIG. 17 are the respective further embodiments all of that are the type including 2-way front loudspeakers.

FIG. 10 is the crossover network circuit diagram of the said loudspeaker system, wherein attenuators (ATT) are provided for enabling the frequency characteristics adjustment freely at will of the particular listeners.

As is evident from the above, the compensation loudspeakers are adapted to flatten or level off the sound power characteristics curve, without thereby affecting the direct sounds straight in front of the loudspeaker, and so they should radiate the compensational sounds only to cover the frequency range where the sound power of the front panel loudspeakers shows depression, and trespassing beyond such range is undesirable.

Furthermore, since the compensation loudspeakers are for providing the indirect sounds to make up for the sound power depression of the sounds radiated from the front loudspeakers in the particular frequency ranges where directivity of these latter loudspeakers becomes evident and such depression results therefrom, it is further preferable that the compensation loudspeakers show no substantial directivity in such compensational sound frequency range, thus, to cause there no sound power depression in such compensation sounds, because negligible sound pressure comes around in the listening space directly from the compensation loudspeaker. Such aim may be attained by selecting the effective vibration radius $a_3$ of the compensation loudspeakers in question, with respect to the upper limit frequency $f_c$ of such sounds therefrom, to satisfy the following formula:

$f_c=(0.5\sim0.6)c/2\pi a_3$.

It may in short be said that the listeners, provided with both the direct and indirect sounds, can hear, in accordance with this invention, the sounds independently of the frequency, the invention providing the frequency response characteristics constant with respect to each of the direct and indirect sounds.

Figure 1:
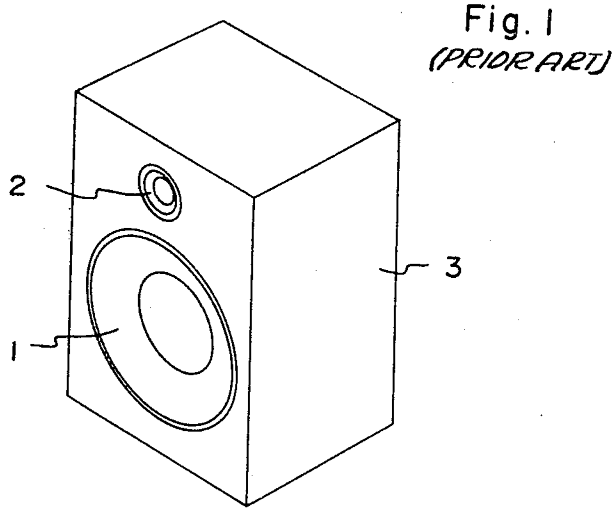
Fig. 1 (PRIOR ART)
FIG. 1 is a perspective view of the conventional 2-way loudspeaker system.
Figure 2:
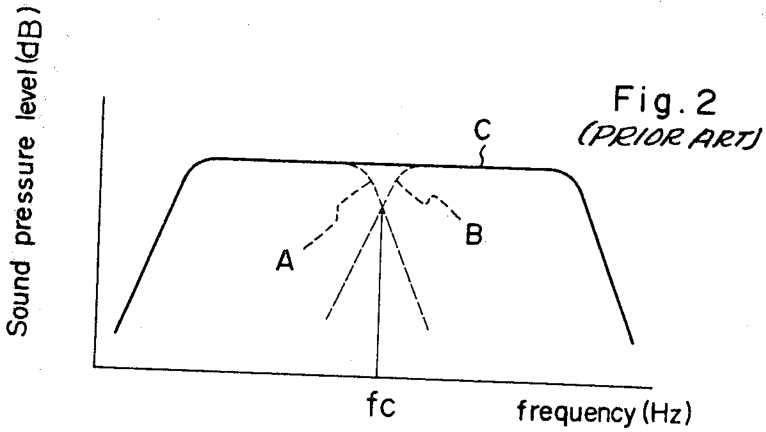
Fig. 2 (PRIOR ART)
FIG. 2 is a diagrammatic representation of the frequency response characteristics of the loudspeaker system of FIG. 1.
Figure 3:
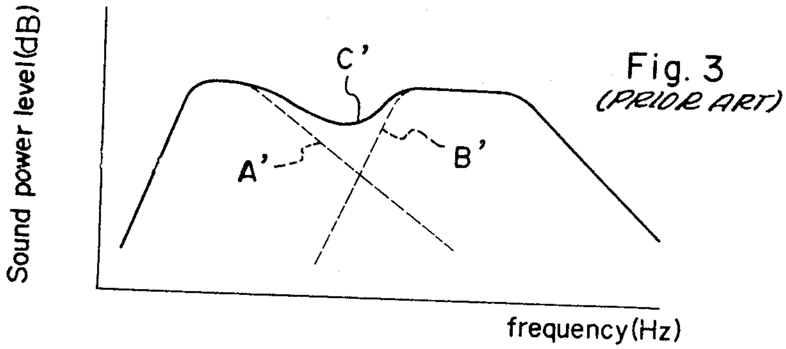
Fig. 3 (PRIOR ART)
FIG. 3 is a diagrammatic representation of the sound power characteristics of the loudspeaker system of FIG. 1.

FIG. 11 through FIG. 17 show the respective modifications, all of them being of the 2-way loudspeaker system. It is supposed that for these FIG. 11 through FIG. 17, the low range loudspeakers (1) and the high range loudspeakers (2) are identical with those as shown in FIG. 1.

Figure 11:
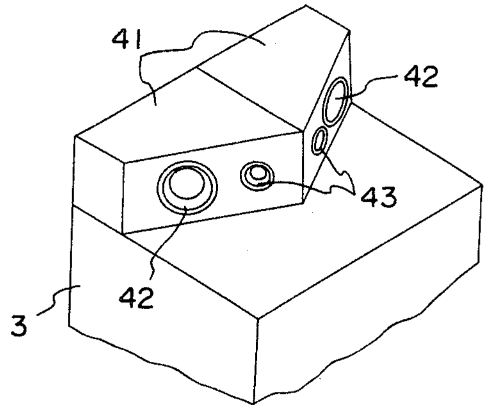
Figure 12:
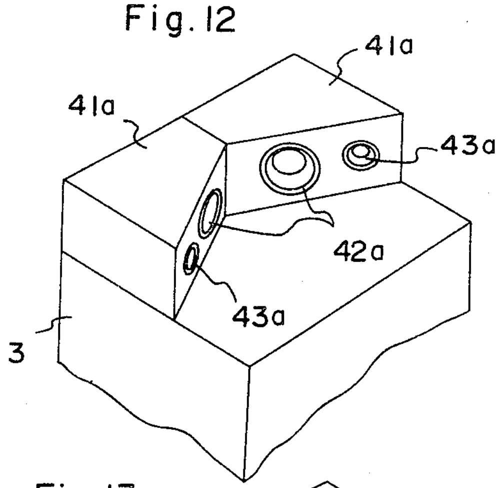
Figure 13:
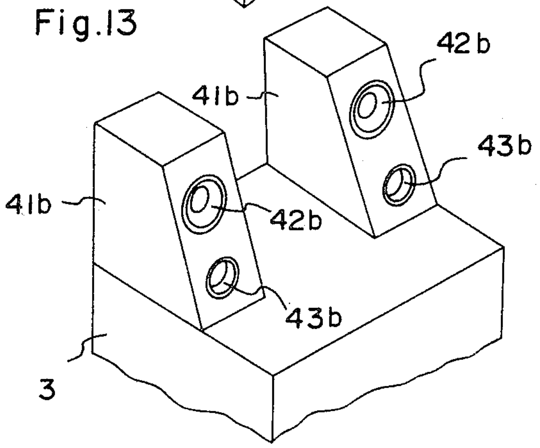

Shown in FIG. 11 through FIG. 13 at (41), (41*a*), (41*b*), respectively, are sub-enclosures accommodating therein the respective first compensation loudspeakers (42), (42*a*), (42*b*) and second compensation loudspeakers (43), (43*a*), (43*b*). Each said sub-enclosure is substantially a trapezoid box, with the said compensation loudspeakers supported on the slant face plate thereof.

It is here supposed that to the first compensation loudspeakers (42), (42*a*), (42*b*) electric input signals are given as properly divided by the crossover network circuit or the like to provide reproduction in the frequency range from $f_1=(0.5\sim0.6)c/2\pi a_1$ to $f_H=f_c=(0.5\sim0.6)c/2\pi a_3$ (with c: sound speed, $a_1$: effective vibration radius of the low range loudspeakers (1), $a_3$: effective vibration radius of the compensation loudspeakers (43), $f_c$: crossover frequency between the lower frequency loudspeaker (1) and the higher frequency loudspeaker (2)), and that to the second compensation loudspeakers (43), (43*a*), (43*b*) electric input signals are given as properly divided by the crossover network ciruit or the like to provide reproduction in the frequency range from $f_H$ $(0.5\sim0.6)c/2\pi a_2$ (with $a_2$: effective vibration radius of the high range loudspeaker (2)) upwards.

With such loudspeaker system, the listeners can hear the direct sounds of the low range loudspeaker (1) and the high range loudspeaker (2) and together therewith their indirect sounds as well, and furthermore in the frequency range where depression is eminent in the said indirect sounds from such loudspeakers (1), (2), the first and second compensation loudspeakers (42), (42*a*), (42*b*), (43), (43*a*), (43*b*) are energized so that overlapping of the indirect sounds, i.e. the sounds of such loudspeakers (42), (43) etc, as reflected by the backside wall may make up the depression of the indirect sounds by the low range loudspeaker and the high range loudspeaker; and it is thus possible to flatten or level off the sound power characteristics over the entire reproduction sound frequency range.

Shown in FIG. 11 is an embodiment wherein the first and second compensation loudspeakers (42), (43) are accommodated in the trapezoid box (41) in such disposition that the radiation axes of such compensation loudspeakers rearwardly extend in outwardly diverging angles, but the compensation loudspeakers may as well be disposed to face rearwardly in inwardly converging angles, as seen in FIG. 12, or to face rearwardly in upward slanting angles, as seen in FIG. 13.

These embodiments, with the said first and second compensation loudspeakers accommodated in the boxes (41) as are made separate from the enclosure(3), allow the listeners to freely select how to dispose such boxes (41), as may be any of the variety of possibilities as illustrated hereinabove by way of example, to thus best adapt to the particular acoustic characteristics of the room they are actually installed in.

Figure 14:
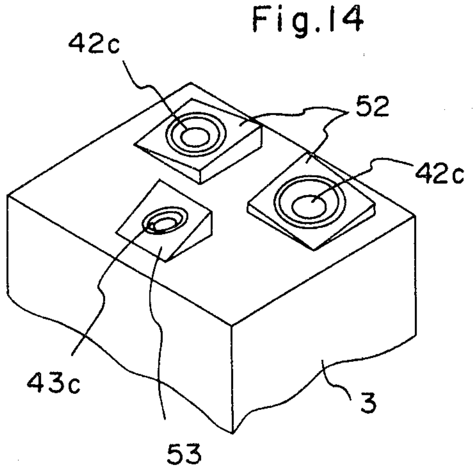

It is as well possible, as shown in FIG. 14, to mount first and second compensation loudspeakers (42*c*), (43*c*) on the top plate of the enclosure (3) via the respective pedestrals (52), (53) designed to provide slanting angles therefor.

It is also possible to widen the angular radiation range by providing the mounting base plate, for the compensation loudspeakers, in arcuately curved surface.

By the way, the number of the first and second compensation loudspeakers is by no means limited to the embodiments shown particularly hereinabove; free selection thereof being rather possible in accordance with the particular designing purpose.

As described hereinabove, this invention realizes flattening or levelling off of the sound power and frequency response characteristics by providing the first and second compensation loudspeakers as the indirect sound emission source as will make up, in the reproduction sound field, the otherwise occurring depression in the indirect sounds in some particular frequency range, and is therefore a practically very useful, effective invention which provides quite excellent reproduction sounds.

Figure 15:
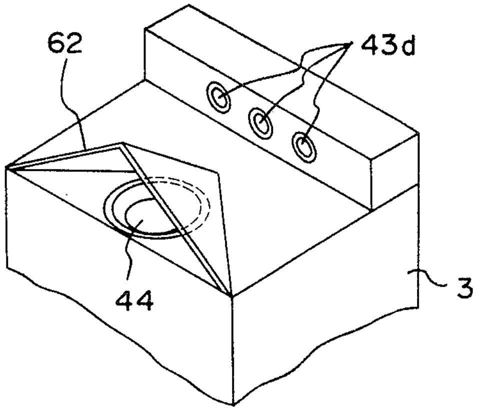

Proceeding with the description now referring to FIG. 15, thus to an embodiment provided with a reflector plate, designated (44) is a first compensation loudspeaker supported behind an opening defined in a top plate of the enclosure (3), with its radiation axis extending upright.

Designated at (62) is a covering reflector plate disposed as to cover up the said opening for the first compensation loudspeaker (44), and it is formed in a shape substantially of a hollow pyramid cut in half with the hollow cut opening lying in a surface along the back of the enclosure.

Designated at (43*d*) are second compensation loudspeakers, and these loudspeakers (43*d*) are so disposed that their radiation axes extend toward outer wall portions of the said reflector plate (62).

With such construction, the sounds from the first compensation loudspeaker (44) are reflected rearwards by inner wall portions of the reflector plate (62) and are further reflected by the wall rearwardly of the enclosure (3) to thus proceed forwards and to ultimately reach the listeners as the indirect sounds.

On the other hand, the radiation sounds from the second compensation loudspeakers (43*d*) are reflected obliquely rearwards by outer wall portions of the reflector plate (62) and are further reflected by the said wall to thus proceed forwards and to ultimately reach the listeners as the indirect sounds.

Such indirect sounds by means of the first and second compensation loudspeakers (44), (43*d*) being thus provided for compensation in the frequency range where depression in the indirect sounds of the loudspeakers (1) and (2) is eminent, it has hereby been made possible to flatten or level off the sound power characteristics over the entire reproduction sound frequency range.

Furthermore, the reflector plate (62) being disposed to have its slant surfaces to cross commonly with radiation axes both of the first and second compensation loudspeakers (44), (43*d*); wide range of propagation is provided by such reflection, thus to provide advantage in realizing the uniform indirect sound field.

Further to be noted with respect to the first compensation loudspeaker (44) is that an acoustic filter is provided by cavity resonance phenomenon of the volume of the space contained by the covering reflector plate (62), thus to realize quite an excellent restriction of the radiated sounds so as to occur only in the frequency range just as required, in cooperation with the function of the said crossover network circuit, to therefore lead to making it still easier to adjust the proper balancing between the direct sounds and the indirect sounds. It is also possible, at need to provide the reflector plate (62) with sound-absorbing lining or the like, thus to alter the frequency characteristics with respect to the indirect sounds.

Figure 16:
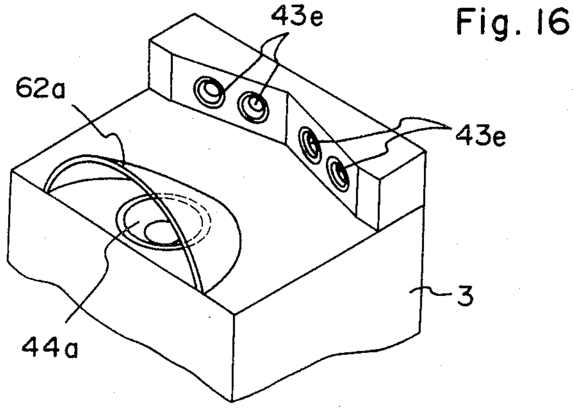

Still further to be noted is that the shape of the reflector plate is by no means limited to that which has been described in the embodiment hereinabove, and adoption for instance of the shape substantially of a sphere as cut in four, as plate 44*a* is shown in FIG. 16, will provide still preferable propagation since the reflection is realized in a still wider angular range.

Figure 17:
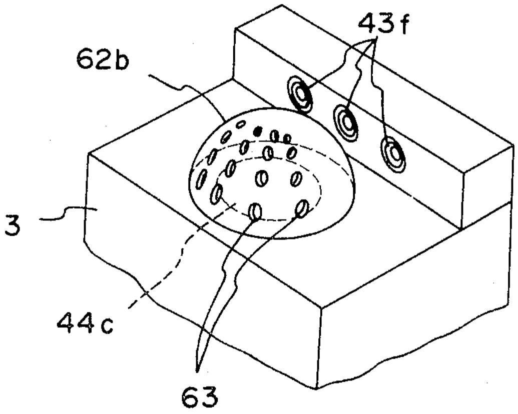

Yet further, it is as well possible, as shown in FIG. 17, to make up the reflector plate substantially in hemispherical shape (62*b*), with provision of proper through passage portion on the rear portion of the hemisphere as realized by a number of perforations (63).

Such construction will provide reflection into quite a wide range, and it is at the same time possible to cause variety of reproduction sound frequency characteristics of the first compensation loudspeaker, designated here at (44*c*), by properly selecting the volume of the hemisphere (62*b*) and the size of the perforations (63) and the like, thus altering the function of the acoustic filter as is provided thereby, with the crossover network circuit mentioned hereinbefore functioning in this regard in cooperation therewith.

By the way, designated at (43*e*), (43*f*) in FIG. 16, FIG. 17 respectively, are the second compensation loudspeakers.

As described hereinabove, it is possible, according to this invention to prevent the otherwise occurring depression of the indirect sounds in some particular frequency range, in the listening space, thus to provide quite excellent reproduction sounds without any sensible unnatural distortion owing to such depression in the indirect sounds in such particular frequency range, and this is therefore a practically very useful invention.

The compensational sound reproduction devices have been illustrated and described as mounted on the enclosure top plate, in all the embodiments given hereinabove by way of example, but such arrangement is not the indispensable requirement, since the gist is only to cause such sounds to propagate generally into the rearward spce, and the said devices may thus as well be disposed either on the lateral sides or on the back side of the enclosure. It is noted, however, that particular advantages, of easy mounting as well as of less space requirement and the like, normally accure from mounting the said devices on the top plate.

We claim:

1. A loudspeaker multi-way system including at least first and second front loudspeakers supported on an enclosure front of a main enclosure in such a manner that the radiation axis extends in a forward direction and the sound pressure as a result of the direct sounds is substantially constant independent of frequency, the system further including at least one compensation loudspeaker associated with said front loudspeakers and which is mounted to radiate indirect sounds and having a configuration so that the sound pressures as a sum of the direct and indirect sounds remains substantially constant independently of frequency and which is so disposed that the radiation sounds thereof are radiated to propagate rearwards, substantially free of forward radiation.

2. The loudspeaker system of claim 1, wherein said compensation loudspeakers are provided corresponding to each respective component front loudspeaker covering the respective frequency ranges of the said multiway system, each of the compensation loudspeakers covering frequency range f as defined by: $kc/2\pi a \leqq f \leqq f_c$ excepting the case of the compensation loudspeaker(s) corresponding to the front loudspeaker for the highest frequency range of which the covering compensation frequency range f is rather defined by: $kc/2\pi a \leqq f$, in either case with:

a: effective vibration radius of the front panel loudspeaker corresponding to such particular compensations loudspeaker(s), $f_c$: higher-side crossover frequency with respect to the said corresponding front panel loudspeaker, c: sound velosity and k: coefficient in the range of 0.5 to 1.0.

3. The loudspeaker system of claim 2, wherein the said coefficient k is selected in the range particularly of $k=0.5 \sim 0.6$.

4. The loudspeaker system of claim 3, wherein the effective vibration radius $a_3$ of each of the compensation loudspeaker is selected to satisfy the following formula in regard to the said higher-side crossover frequency $f_c$ with respect to the said corresponding front panel loudspeaker: $f_c=(0.5 \sim 0.6)c/2\pi a_3$.

5. The loudspeaker system of claim 1, wherein said compensation loudspeaker includes at least one compensation loudspeaker facing upright, and a reflector plate disposed in a region forwardly of the said loudspeaker(s) in such a manner as to reflect, with the inner surface thereof, radiation sounds of the said loudspeaker(s) to direct same thereafter in a rearward direction.

6. The loudspeaker system of claim 5, wherein at least one compensation loudspeaker facing rearwards is disposed forwardly of the said reflector plate in such a manner that the radiation sounds from the said loudspeaker(s) are reflected by the reflector outer surface to propagate thereafter divergingly in the rearward space.

7. The loudspeaker system of claim 6, wherein the said reflector plate is constructed in a dome-like shape having at least one opening in a rearward region thereof.

8. The loudspeaker system of claim 6, wherein the said reflector plate is constructed in a spherical segment in a open rearwards direction.

9. The loudspeaker system of claim 6, wherein the said reflector plate is made up of component triangular plates as are combined in abutment to be open in a rearwards direction.

10. The loudspeaker system of claim 2, wherein each compensation loudspeaker is supported on an oblique surface of a separate enclosure not fixed to said main enclosure to allow free selection of the mounting position.

11. The loudspeaker system of claim 2, wherein the said compensation loudspeakers are supported on the main enclosure top plate.

12. The loudspeaker system of claim 11, including at least one compensation loudspeaker mounted with the radiation center axis thereof extending rearwardly upwardly, at least one compensation loudspeaker with the radiation center axis thereof extending rearwardly at an angle to the left with respect to a horizontal plane and said main enclosure.

13. The loudspeaker system of claim 11, including at least one compensation loudspeaker having an annular ring slit with the center axis thereof extending rearwardly upwardly.

14. The loudspeaker system of claim 13, including a plurality of compensation loudspeakers with radiation center axes extending rearwardly upwardly, extending rearwardly upwardly at an angle to the right with respect to a horizontal plane, and extending rearwardly upwardly at an angle to the left, with respect to said horizontal plane, respectively, at least one each, as well as a loudspeaker facing upright supported on the said top plate and a reflector plate disposed thereover.

* * * * *